United States Patent [19]

Beatty

[11] Patent Number: 4,925,524
[45] Date of Patent: May 15, 1990

[54] METHOD FOR FORMING TUNGSTEN STRUCTURES IN A SEMICONDUCTOR

[75] Inventor: Christopher C. Beatty, Ft. Collins, Colo.

[73] Assignee: Hewlett-Packard Company, Palo Alto, Calif.

[21] Appl. No.: 293,550

[22] Filed: Jan. 4, 1989

Related U.S. Application Data

[63] Continuation of Ser. No. 62,261, Jun. 12, 1987, abandoned.

[51] Int. Cl.$^5$ .......................................... H01L 21/302
[52] U.S. Cl. .................................... 156/643; 156/652; 156/656; 156/664
[58] Field of Search ............... 156/643, 646, 652, 656, 156/659.1, 664, 904; 437/192, 228, 245, 246

[56] References Cited

U.S. PATENT DOCUMENTS

| | | | |
|---|---|---|---|
| 3,969,197 | 7/1976 | Tolar et al. | 204/15 |
| 4,203,800 | 5/1980 | Kitcher et al. | 156/643 |
| 4,229,247 | 10/1980 | Chiu et al. | 156/643 |
| 4,617,730 | 10/1986 | Geldermans et al. | 29/843 |
| 4,637,129 | 1/1987 | Derkits, Jr. et al. | 156/656 X |
| 4,695,872 | 9/1987 | Chatterjee | 357/75 |

OTHER PUBLICATIONS

H. Abraham et al., "NMOS-111 Photolithography", Hewlett-Packard Journal, Aug. 1983, pp. 34–37.

Fischl et al., "Plasma Enhanced Etching of Tungsten and Tungsten Silicide in Chlorine-Containing Discharges", Solid State Science and Technology, pp. 2265–69, Sep. 1987.

Primary Examiner—Kenneth M. Schor
Attorney, Agent, or Firm—William W. Cochran, II

[57] ABSTRACT

A method and system for forming tungsten structures in a semiconductor device which uses a chromium protective layer to protect underlying semiconductor layers during the etching process and a chromium mask layer so that tungsten structures can be formed with high aspect ratios using a reactive ion etching to etch the tungsten with a carbon tetrafluoride oxygen plasma in a reactive ion etcher. Long overetches can be achieved because of the high selectivity of chromium to the carbon tetrafluoride/oxygen plasma. The anisotropic nature of the reactive ion etcher prevents undercut during long overetches of the tungsten to further decrease losses in linewidth or increases in resistance as a result of overetching.

3 Claims, 4 Drawing Sheets

METHOD FOR FORMING TUNGSTEN STRUCTURES IN A SEMICONDUCTOR

This application is a continuation of application Ser. No. 062,261, filed June 12, 1987, now abandoned.

BACKGROUND OF THE INVENTION

1. Field of the Invention.

The present invention pertains generally to semiconductor fabrication and more specifically to multilevel integrated circuit metallization processes and devices.

2. Description of the Background.

The formation of conductors and other structures in a semiconductor using multilevel metallization processes typically employ aluminum that is deposited using conventional techniques such as sputtering. Although aluminum is simple and easy to work with in these processes, it has certain disadvantages when employed in a semiconductor device.

Aluminum is particularly susceptible to electromigration problems As current passes through aluminum structures formed in a semiconductor, the atoms of the aluminum tend to migrate because of the low bonding strengths between the atoms. This is also reflected in the low melting temperature of aluminum. In very small structures in the semiconductor, e.g., one micron wide conductors, the migration of the aluminum atoms in response to the flow of current can cause an open circuit. Due to the effect of electromigration, strict limits must be imposed as to the minimum size of structures formed from aluminum in a semiconductor circuit.

Aluminum also tends to corrode quite easily in a semiconductor circuit. Typically, the pattern of structures is formed through a process of etching using a chlorine based etcher. If any of the chlorine is left behind after the etching process is completed, it acts as a catalyst to corrode the aluminum layer. For example, if any aluminum chloride remains it will react with water to form aluminum oxide, aluminum hydroxide and hydrochloric acid, which in turn combines with the aluminum in the circuit to form aluminum chloride, such that the process continues in a progressive fashion to corrode the aluminum in the circuit. Because of the complex structures that exist in most semiconductor circuits, it is extremely difficult to remove all of the aluminum chloride to prevent deterioration of the circuit due to corrosion of the aluminum.

The methods of depositing aluminum using physical vapor deposition techniques such as sputtering and evaporation can also cause problems in the resulting semiconductor device. For example, shadowing and geometric effects occur when aluminum is deposited using conventional physical vapor deposition techniques. In other words, deposition of aluminum by the process of sputtering over a structured topology having, e.g., steps and deep holes on the surface of the semiconductor, will many times not provide a uniform covering of the uneven surface topology. More specifically, physical vapor deposition techniques will not provide a uniform deposition of aluminum atoms on the back side of tall structures and aluminum atoms will not be deposited in holes such that a uniform surface coverage is provided. When the surface is etched, discontinuities are likely to occur because of the nonuniform coverage.

Another problem that occurs because of the nonplanarity of the substrate is that stringers, i.e., unetched portions of thick layers of the aluminum surrounding steps on the semiconductor surface, are not eliminated during the etching process so that a short circuit is produced between adjacent aluminum structures. In the process of etching the aluminum, the etching process is allowed to continue to fully etch the flat portions of the aluminum which are inherently much thinner than the thicker portions that occur around steps on the semiconductor. If the stringer exists between two adjacent conductors, for example, a short circuit will result. To eliminate stringers, overetching is employed to ensure that all the aluminum is removed in the etching areas. However, the process of overetching, in this manner, to remove stringers, will many times result in undercutting and other degradation of the aluminum structure, as well as damage to other surfaces, such as semiconductor surfaces on the semiconductor chip The undercutting process, i.e., the removal of aluminum at the interface of the aluminum and the surface in which it is deposited, can also cause discontinuities and reduce the width of the aluminum structure to further intensify electromigration problems and increase line resistance.

Additionally, to ensure conductivity for vias, i.e., connections between two vertically disposed metal conductors in a semiconductor circuit, and between contacts, i.e., connection between a vertically disposed metal layer and a silicon layer, dogbones are typically employed. A dogbone comprises a widened portion of the circuit to ensure full horizontal registration between the layers that are designed to be conductively connected. When working in the one micron region, full horizontal registration between vertically disposed layers does not always occur. In many cases, a trench or deep hole will form at the contact or via adjacent to the underlayer to which the connection is to be made. Since sputtered aluminum will not penetrate and deposit in deep holes or trenches, proper contact is not made unless there is enclosure of the via. Hence, the widened portions, or dogbones, are provided to ensure that full horizontal registration occurs and adequate contact is made. The disadvantage of using dogbones is that they limit the density of the circuit since the electromigration problems of aluminum inherently limit the minimum size of the aluminum structures in the circuit. In other words, the minimum width of the aluminum structures is increased since widened portions must be provided to ensure horizontal registration and full conductive contact at vias and contacts.

SUMMARY OF THE INVENTION

The present invention overcomes the disadvantages and limitations of the prior art by providing an improved method of forming tungsten structures on a semiconductor device. The tungsten structures are deposited over a protective chromium layer that is sputtered onto the surface of the semiconductor. The tungsten layer is deposited using low pressure chemical vapor deposition techniques which provides a uniform layer of tungsten that is capable of filling deep holes and trenches in a uniform manner without producing shadowing effects. A second chromium layer is deposited over the surface of the tungsten layer and etched using a photoresist mask using a mixture of oxygen and chlorine ions in a reactive ion etcher. The second chromium layer is very thin compared to the photoresist layer so that the second chromium layer is etched very easily to form the mask with minimal linewidth loss. The mixture of oxygen and chlorine ions selectively etch chromium at a higher rate than tungsten so that there is minimal degradation of the tungsten layer during etching of the second chromium layer. The tungsten layer is then etched with a mixture of carbon tetraflouride and oxygen ions in a reactive ion etcher which comprises an extremely anisotropic etching process to maintain the integrity of the tungsten structure. Since the carbon tetraflouride and oxygen ions selectively etch tungsten at a higher rate than chromium, there is minimal erosion of the hard chromium mask and minimal linewidth degradation of the tungsten structure during etching. Additionally, the first chromium layer protects underlying layers, such as semiconductor layers, during the process of etching the tungsten. A mixture of oxygen and chlorine ions is then used to etch the chromium mask and the exposed portions of the first chromium layer using a reactive ion etcher. Since the oxygen and chlorine ions selectively etch chromium at a higher rate than the underlying layers of the semiconductor and the tungsten, the tungsten and underlying layers of the semiconductor are not damaged during the chromium etching process.

The advantages of the present invention are that the tungsten structures have a high melting temperature, are harder and more dense and are not nearly as susceptible to electromigration problems as aluminum. Hence, the inherent limitations on minimal size of tungsten structures is much smaller than the inherent size limitations of aluminum Consequently, much greater circuit densities can be achieved using tungsten structures.

Additionally, tungsten hexaflouride comprises the byproduct of the etching process using carbon tetraflouride and oxygen ions. Since tungsten hexaflouride does not have a strong affinity for water, the corrosion problems inherent with the use of chlorine atoms in the process of etching aluminum do not exist Moreover, the low pressure chemical vapor deposition process provides a conformal fill of tungsten over a semiconductor surface having a non-uniform topology. This eliminates the need for dogbones in the circuit and further increases the circuit density that can be achieved using the present invention. Additionally, the bottom chrome layer allows for long overetches without damaging either the underlying semiconductor layer or the tungsten structures since reactive ion etching techniques are used which do not cause undercutting. Hence, the integrity of the circuit can be maintained while long overetches are being employed to remove stringers.

DETAILED DESCRIPTION OF THE PRESENT INVENTION

Figure 1:
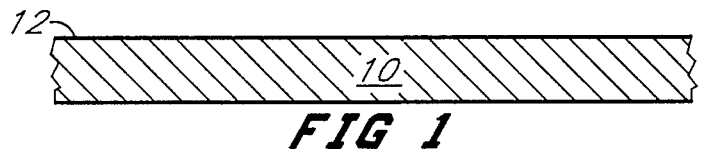
FIG. 1 is a schematic illustration of an underlying semiconductor layer.

FIG. 1 discloses a schematic illustration of a semiconductor layer having an upper surface 12 which may be comprised of a series of structures forming a non-uniform topology, but which is schematically shown as a flat surface 12 for the purposes of illustration.

Figure 2:
FIG. 2 is a schematic illustration of an underlying semiconductor layer with a chromium layer deposited on its surface.

FIG. 2 comprises a schematic illustration of the semiconductor layer 10 and a chromium layer 14 that is deposited on the surface 12 of the semiconductor layer 10. The chromium layer can be deposited using any desired method of depositing chromium including sputtering or other physical vapor deposition. The chromium layer 14 provides a protective layer for semiconductor layer 10. Chromium layer 14 is typically in the range of 300 to 600 angstroms thick.

Figure 3:
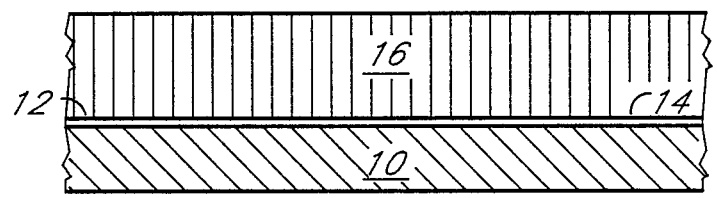
FIG. 3 is a schematic illustration of a semiconductor layer, a chromium layer and a tungsten layer.

FIG. 3 is a schematic drawing illustrating the tungsten layer 16 which is deposited on the surface of a chromium layer 14 using chemical vapor deposition techniques. The deposition occurs through hydrogen reduction of tungsten hexaflouride at temperatures between 300° C. and 400° C., depending primarily on the deposition rate desired. Film thicknesses of the tungsten layer 16 range from 3,000 angstroms to more than 20,000 angstroms. The chemical vapor deposition process used to deposit the tungsten layer 16 provides a uniform layer of tungsten which fills any deep holes or trenches that have been formed on the upper layer 12 of semiconductor 10 and the upper surface of chromium layer 14.

Figure 4:
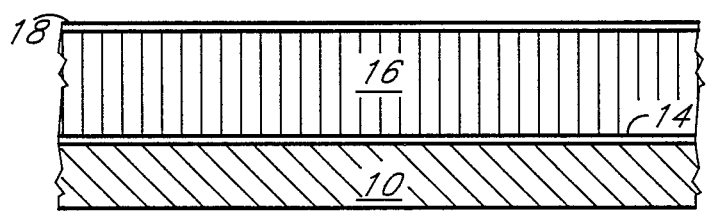
FIG. 4 is a schematic illustration of a semiconductor, a first chromium layer, a tungsten layer and a second chromium layer.
Figure 5:
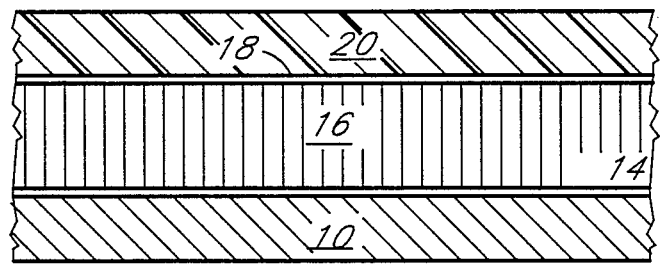
FIG. 5 is a schematic illustration of a semiconductor layer, a first chromium layer, a tungsten layer, a second chromium layer and a photoresist layer.
Figure 6:
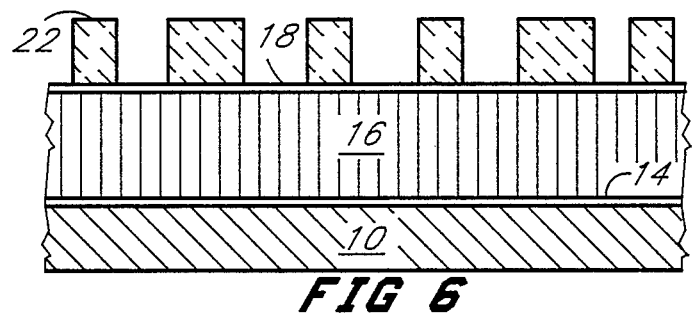
FIG. 6 is a schematic illustration of the device of FIG. 5 with the photoresist layer etched in a predetermined pattern.

FIG. 4 schematically illustrates the structure of FIG. 3 with a second chromium layer 18 deposited on the upper surface of tungsten layer 16. Again, the chromium layer 18 can be deposited using any conventional deposition process desired. Since the second chromium layer 18 will function as a mask after etching and has a high selectivity to the carbon tetraflouride oxygen plasma mixture, it can be quite thin, i.e., on the order of 200-600 angstoms FIG. 5 schematically illustrates the device of FIG. 4 with an additional photoresist layer 20 deposited on the upper surface of the second chromium layer 18. Any desirable photoresist process can be employed including a standard photoresist or a two layer resist process. The PMMA two layer process typically used is more completely disclosed in Abraham, H., Bartlett, K., Hillis, G., Stoltz, M., Wilson, M., *Hewlett-Packard Journal* pp. 34–37, August, 1983, and is particularly useful for metal levels which tend to be both highly reflective and non-planar FIG. 6 illustrates the manner in which the photoresist layer 20 is etched to form a mask for etching the second chromium layer 18. In order to etch the photoresist layer 20, the photoresist layer 20 must be exposed with a light source. Reflections from underlying layers can degrade the process of exposure to reduce the fidelity of the process. The chromium layer 18 functions to reduce the overall reflectance that otherwise would occur from the tungsten layer 16 by 35% at 436 nanometers using a 400 angstrom chrome film over a 5,000 angstrom tungsten layer deposited using LPCVD techniques. The reflected light intensity from the structure illustrated in FIG. 5 is less than one third that of bare aluminum Hence, the structures of the photoresist mask 22 illustrated in FIG. 6 have a highly uniform structure.

Figure 7:
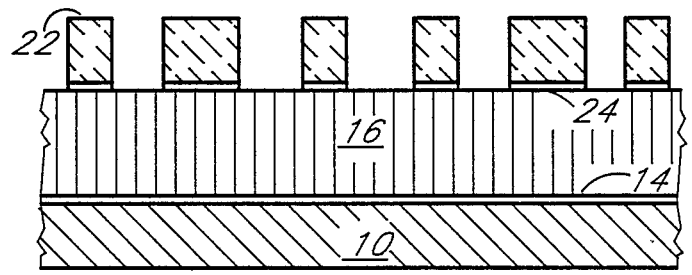
FIG. 7 is a schematic illustration of the device of FIG. 6 with the second chromium layer etched in accordance with the photoresist layer.
Figure 11:
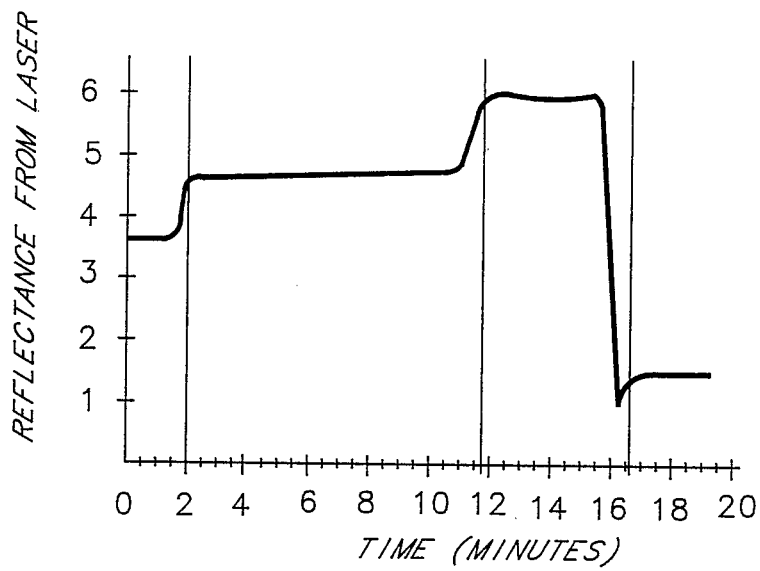
FIG. 11 is a plot of time verses laser reflectance to illustrate the etching process of the present invention.

FIG. 7 illustrates the manner in which the chromium layer 18 (FIG. 6) is etched using a photoresist mask 22 to form chromium mask 24 corresponding to the photoresist mask 22. Again, the underlying structure comprising the tungsten layer 16, first chromium layer 14 and semiconductor layer 10 remain as illustrated in FIG. 6 Etching of the chromium layer 18 is performed by an Applied Materials AME8130 Reactive Ion Etcher available from Applied Materials, Inc. located in Santa Clara, CA and is controlled by a Hewlett-Packard 9836 computer available from Hewlett-Packard Company, Palo Alto, CA. The computer monitors the status of the etcher through an RS-232 link and the output of a laser reflectometer is fed into an HPIB digital voltmeter so that the computer can monitor the progress of the etch as it proceeds. The computer utilizes predetermined endpoint criteria to determine the end of the etching process, as illustrated in FIG. 11 and as described below. A mixture of oxygen and chlorine ions forming a plasma in the reactive ion etcher is used to etch the chromium layer 18 which replicates the photoresist mask 22 with high fidelity. Although the ratio of selectivites selectivity of the oxygen/chlorine plasma to the chromium/photoresist (PMMA) is not extremely high (1:2, CR:PMMA), the linewidth loss of the chromium mask 24 is quite small (<0.1 microns total), since the second chromium layer is very thin, i.e., on the order of 500 angstroms or less. The photoresist mask 22, on the other hand, normally ranges between 1.3 and 1.4 microns. Additionally, the anisotropic nature of etching with a reactive ion etcher reduces the amount of linewidth loss. The oxygen/chlorine plasma selectively etches chromium at a much higher rate than tungsten so that the process of etching the chromium mask 24 can proceed with long overetching, without damaging tungsten layer 16.

Figure 8:
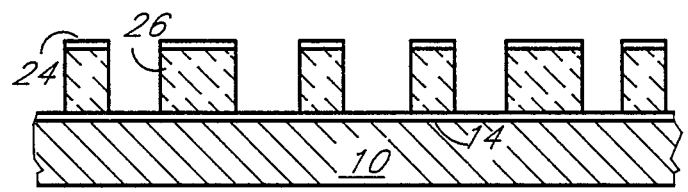
FIG. 8 is a schematic illustration of the device of FIG. 7 with the photoresist layer removed and the tungsten layer etched in accordance with the chromium mask.
Figure 9:
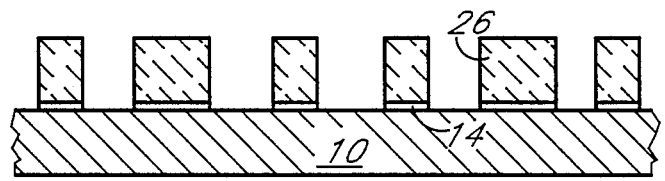
FIG. 9 is a schematic illustration of the semiconductor device produced in accordance with the present invention.

FIG. 8 schematically illustrates the manner in which tungsten layer 16 (FIG. 7) is etched to form tungsten structures 26. A carbon tetraflouride/oxygen plasma is used in the AME8130 reactive ion etcher to etch the tungsten layer 16 (FIG. 7) and remove portions of the tungsten that do not lie beneath the chromium mask 24, as illustrated in FIG. 8, to form tungsten structures 26. Since the carbon tetrafluoride/oxygen plasma etches tungsten structures 26 at a much higher rate than chromium, i.e., greater than 50:1, very little line width loss is produced by erosion of chromium mask 24. Additionally, first chromium layer 14 functions as a protective layer for semiconductor layer 10 so that the process of etching the tungsten to form tungsten structure 26 can proceed with a long overetch and not damage the semiconductor layer 10. This is advantageous in that stringers and other undesirable structures can be removed by overetching. Again, the anisotropic nature of the reactive ion etcher prevents undercutting of the tungsten structures 26 so that a high degree of integrity and structural uniformity is produced even though long overetches are employed in this process Additionally, the photoresist mask 22 is inherently removed during the tungsten etching process so that the structure illustrated in FIG. 8 remains after the process of etching the tungsten is completed FIG. 9 illustrates the manner in which the chromium mask 24 and chromium layer 14 are etched to leave the tungsten structures 26, as illustrated in FIG. 9. Again, an oxygen/chlorine plasma is used to remove the chromium mask 24 and exposed portions of chromium layer 14. The oxygen/chlorine plasma etches the chromium at a much higher rate than the tungsten structures 26 and semiconductor layer 10, which can comprise silicon dioxide, titanium disilicide, silicon or aluminum so that no damage occurs to semiconductor layer 10. The result of the etching process is a series of tungsten structures 26 that are disposed on chromium pads 14, which are in turn disposed on semiconductor layer 10. The tungsten structures have a high degree of uniformity and structure integrity and long overetches have been used to eliminate stringers or other undesirable structures.

Figure 10:
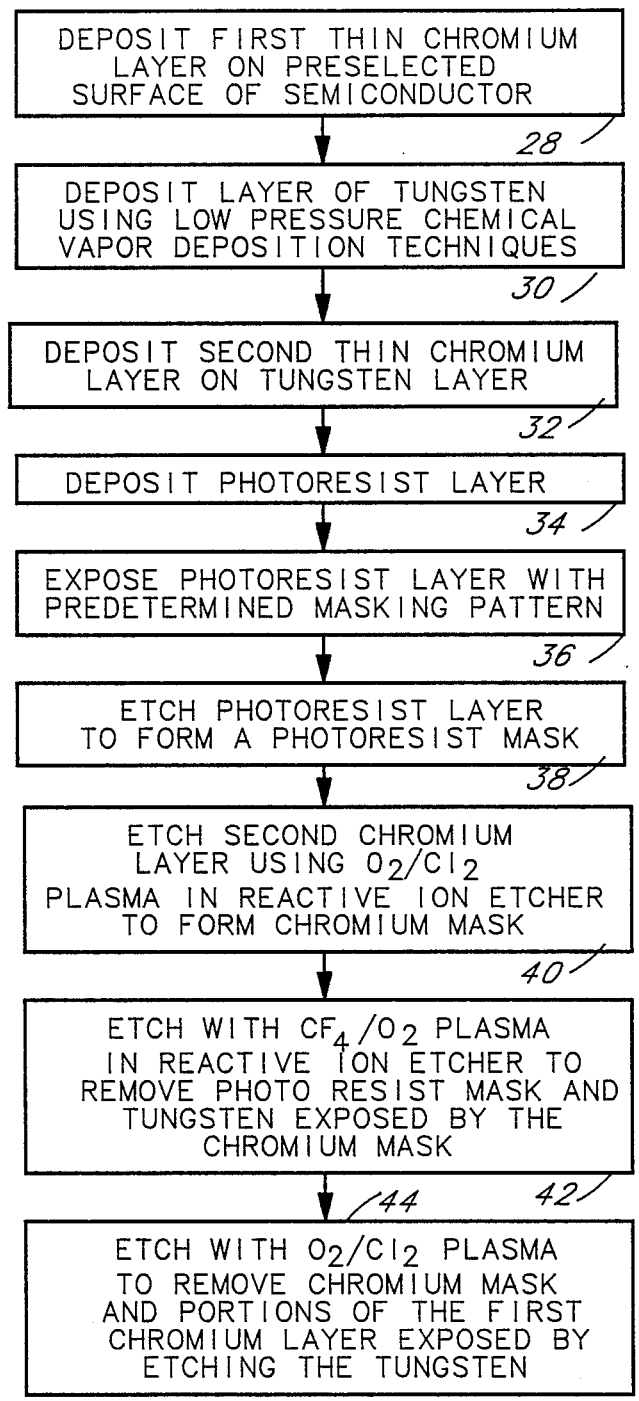
FIG. 10 is a schematic flow diagram of the process employed in accordance with the present invention.

FIG. 10 is a schematic illustration of the various steps described in forming the structures illustrated in FIGS. 1-9. As illustrated in FIG. 10, a thin layer of chromium 14 is deposited on a preselected surface 12 of semiconductor 10, as disclosed in step 28. As disclosed in step 30, the layer of tungsten 16 is deposited using low pressure chemical vapor deposition techniques (LPCVD) to provide a uniform layer of tungsten over the upper surface of chromium layer 14. As disclosed at step 32, a second thin layer of chromium 18 is deposited over the tungsten layer 16 using conventional sputtering techniques. As disclosed at step 34, a photoresist layer 20 is deposited over the second chromium layer 18. The photoresist layer 20 is then exposed with a predetermined light pattern and etched to form a photoresist mask 22, as illustrated in steps 36 and 38. The second chromium layer 18 is then etched using an oxygen/chlorine plasma in a reactive ion etcher to form the chromium mask 24. A carbon tetraflouride/oxygen plasma is then used to etch the tungsten layer 16 to form tungsten structures 26. Since the ratio of selectivities of the photoresist mask 22 to the carbon tetraflouride/oxygen plasma is not large (1:1) all of the photoresist mask 22 is removed during the etching process for tungsten thicknesses greater than approximately 5,000 angstroms. The chromium mask and portions of the first chromium layer exposed during the etching of the tungsten are then removed using an etching plasma comprising oxygen and chlorine ions in a reactive ion etcher FIG. 11 is a plot of laser reflectance versus the etching time for the etching processes illustrated in FIGS. 7-10. As disclosed above, a laser reflectometer is used to determine the reflectance of the semiconductor during the etching processes. Since the reflectance of the surface of the semiconductor changes as different layers are etched, a good indication can be obtained as to the stage of the etching process from the reflectance. This information is fed to the computer to determine endpoint criteria and control the reactive ion etcher to stop the etching process. As illustrated in FIG. 11, the etching process for removing the second chromium layer 18 to form chromium mass 24 occurs at two minutes with sufficient overetch as illustrated in FIG. 11. The tungsten etch then proceeds to approximately 14 minutes with sufficient overetch to remove stringers, as also illustrated by the plot line of FIG. 11. The etch of the chromium protective layer 14 then proceeds to almost 19 minutes where a large change in reflectance occurs indicating that the chromium layer 14 has been removed.

Figure 12:
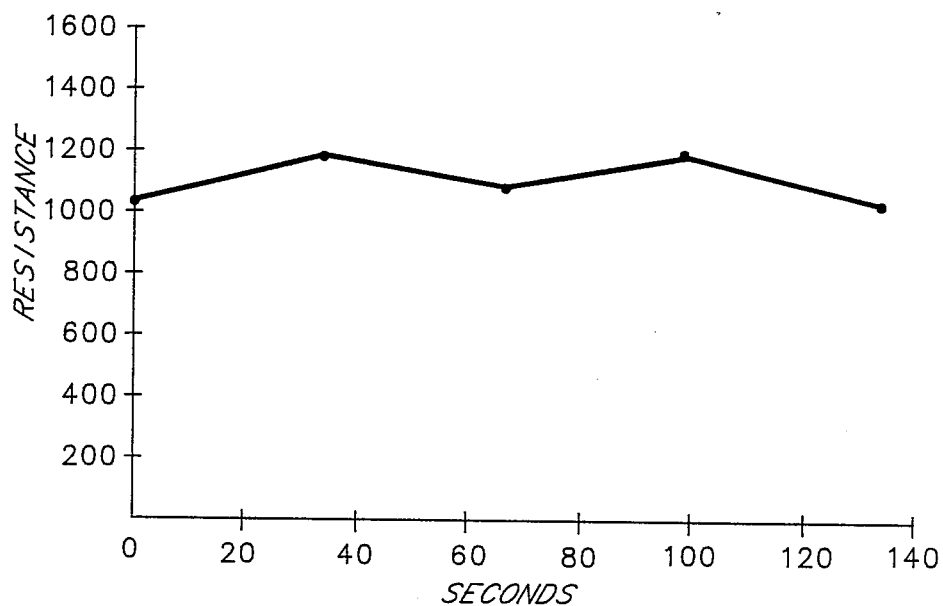
FIG. 12 is a plot of the line resistance of a conductor formed in accordance with the present invention versus etching time.

FIG. 12 is a plot of line resistance versus seconds of etching the tungsten layer to achieve a overetch. As illustrated by the plot of FIG. 12, there is a minimal increase in the resistance of the tungsten structures due to linewidth loss, or undercutting, even though overetches of 100% or more are employed. The data indicates that a 5% increase in resistance for a 0.9 micron-wide line is produced for more than a 100% overetch. The ability to overetch by this amount without causing harm to the tungsten structure is a significant advantage of the present invention.

Hence, the present invention provides a method of forming tungsten structures in a semiconductor device which allows for a high degree of uniformity and long overetches without degrading the integrity of the resulting tungsten structures or degrading underlying semiconductor layers. High aspect ratio tungsten conductors can be formed using the method of the present invention which have a significant advantage over similar aluminum structures in that they are not susceptible to electron migration problems or corrosion because of the etching plasmas used in the process. Additionally, the use of low pressure chemical vapor deposition techniques to deposit the tungsten eliminates the need for dogbones which further increases the circuit density achievable in the present invention. The anisotropic nature of the plasma etching techniques allows for long overetches to remove stringers and other undesirable structures without causing undercutting or degrading the high aspect ratio tungsten structures. The high etch rate of the carbon tetraflouride/oxygen plasma for tungsten and low etch rate for chromium results in minimal linewidth loss and protection of the underlying semiconductor layers.

The foregoing description of the invention has been presented for purposes of illustration and description. It is not intended to be exhaustive or to limit the invention to the precise form disclosed, and other modifications and variations may be possible in light of the above teachings. For example, the present invention can be patterned in submicron metal lines with aspect ratios of up to 1. The present invention can also be integrated into a three level metallization process with two levels of two micron pitch and fully external contacts on all three levels. The embodiment was chosen and described in order to best explain the principles of the invention and its practical application to thereby enable other skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of forming tungsten structures in a multilevel integrated circuit metallization process, said method comprising the steps of:
    forming a first layer of chromium on a preselected surface of an integrated circuit utilized in said multilevel integrated circuit metallization process to provide a protective etch stop layer over said preselected surface;
    depositing a layer of tungsten over said first layer of chromium using low pressure chemical vapor deposition technique to uniformly cover said first layer of chromium;
    forming a second layer of chromium over said layer of tungsten;
    masking said second layer of chromium with a masking material in a predetermined masking pattern;
    plasma etching unmasked portions of said second layer of chromium with chlorinated plasma ions that selectively etch chromium at a higher rate than said tungsten to form a chromium mask corresponding to said predetermined masking pattern;
    plasma etching portions of said tungsten layer unmasked by said chromium mask to form tungsten structures and to remove said masking material using reactive oxygenated fluoridated plasma ions that selectively etch said tungsten layer at a higher rate than said chromium mask so that said tungsten layer can be etched for a sufficiently long period to remove tungsten stringers that form conductive paths between said tungsten structures with minimal lateral etching of said tungsten resulting and with protection of said preselected surface of said integrated circuit from said reactive fluorinated plasma ions by said first layer of chromium;
    plasma etching said chromium mask and said first layer of chromium with chlorinated plasma ions that selectively etch chromium at a higher rate than tungsten to remove exposed portions of both said first and second layers of chromium to electrically isolate said tungsten structures so that said tungsten structures can be used as conductors in said integrated circuit while minimizing etching of said tungsten.

2. The method of claim 1 wherein said step of forming said first layer of chromium comprises the step:
    sputtering said chromium onto said preselected surface.

3. The method of claim 1 wherein said step of masking said second layer of chromium comprises the steps of:
    masking said second layer of chromium with a photoresistive mask that has a thickness in comparison to said second layer of chromium such that insufficient line-width loss occurs to affect performance of said tungsten structures as a result of said plasma etching of said second layer of chromium.

* * * * *